United States Patent
Smith

(10) Patent No.: US 9,281,041 B1
(45) Date of Patent: Mar. 8, 2016

(54) DELAY-BASED READ SYSTEM FOR A MAGNETORESISTIVE RANDOM ACCESS MEMORY (MRAM) BIT

(71) Applicant: Honeywell International Inc., Morristown, NJ (US)

(72) Inventor: Michael A. Smith, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/572,400

(22) Filed: Dec. 16, 2014

(51) Int. Cl.
*G11C 13/00* (2006.01)
*G11C 11/16* (2006.01)

(52) U.S. Cl.
CPC ........ *G11C 11/1673* (2013.01); *G11C 13/0002* (2013.01); *G11C 13/004* (2013.01); *G11C 2013/0054* (2013.01)

(58) Field of Classification Search
CPC ........... G11C 11/1673; G11C 13/0004; G11C 13/002; G11C 2013/004; G11C 2013/0002; G11C 201/00543
USPC ............... 365/158, 148, 163, 189.15
See application file for complete search history.

(56) References Cited

U.S. PATENT DOCUMENTS

| | | | |
|---|---|---|---|
| 6,128,239 A | 10/2000 | Perner | |
| 6,512,688 B2 | 1/2003 | Thewes et al. | |
| 6,738,303 B1 | 5/2004 | Subramanian et al. | |
| 6,862,208 B2 | 3/2005 | Palmer et al. | |
| 6,901,005 B2 | 5/2005 | Perner et al. | |
| 6,901,020 B2 * | 5/2005 | Baker | G11C 7/06 365/148 |
| 7,505,334 B1 | 3/2009 | Breitwisch et al. | |
| 7,852,665 B2 * | 12/2010 | Chen | G11C 7/062 365/148 |
| 8,116,126 B2 | 2/2012 | Breitwisch et al. | |
| 8,203,869 B2 | 6/2012 | Jung et al. | |
| 8,493,776 B1 | 7/2013 | Yu et al. | |
| 8,537,606 B2 | 9/2013 | Kim et al. | |
| 8,587,994 B2 | 11/2013 | Kim et al. | |
| 8,687,412 B2 | 4/2014 | Chih et al. | |
| 8,724,413 B2 | 5/2014 | Ranjan et al. | |
| 8,848,419 B2 | 9/2014 | Wu et al. | |
| 2012/0327701 A1 | 12/2012 | Nazarian | |
| 2014/0169069 A1 | 6/2014 | Oh | |
| 2014/0269029 A1 | 9/2014 | Kinney et al. | |

* cited by examiner

Primary Examiner — Tan T. Nguyen
(74) *Attorney, Agent, or Firm* — Shumaker & Sieffert, P.A.

(57) ABSTRACT

In one example, the disclosure is directed to a memory system comprising a control module. The memory system further includes a first circuit and a second circuit that each receives a control signal from the control module. Each circuit includes a resistor (MRAM element or a fixed resistor) and a capacitor situated between the resistor and a reference voltage. The first circuit is configured to output a data signal after the first capacitor is charged. The second circuit is configured to output a reference signal after the second capacitor is charged. The memory system further includes an arbiter configured to receive the data signal from the first circuit and the reference signal from the second circuit, determine whether the data signal arrived before the reference signal, and determine whether the MRAM is in a high or low state based on whether the data signal or the reference signal arrived first.

20 Claims, 10 Drawing Sheets

DELAY-BASED READ SYSTEM FOR A MAGNETORESISTIVE RANDOM ACCESS MEMORY (MRAM) BIT

TECHNICAL FIELD

The disclosure relates to magnetoresistive random access memory (MRAM) and, more particularly, to read systems for MRAM.

BACKGROUND

MRAM is a non-volatile memory technology in which data are stored using magnetic domains. Because MRAM is non-volatile, the data stored in the magnetic domains is maintained without requiring power to continually refresh the magnetic domains. Additionally, MRAM may provide desirable read speeds, write speeds, and device longevity. Because of these characteristics, MRAM may be used in a variety of applications, such as long-term storage (e.g., in place of or as a complement to a hard disc drive or a solid state drive), or device memory (e.g., in place of or as a complement to dynamic random access memory (DRAM) and/or static random access memory (SRAM)). An MRAM element consists of a fixed magnetic layer, a thin dielectric tunnel barrier, and a free magnetic layer. When bias is applied to the MRAM element, electrons that are spin polarized by the magnetic layers traverse through the dielectric barrier. An MRAM element will have a high resistance when the magnetic moment of the free layer is oriented anti-parallel to the fixed layer and a low resistance when the magnetic moment of the free layer is parallel to the fixed layer. As temperatures increase, the delta resistance between the low and high states gets smaller making it more difficult to distinguish between the two.

SUMMARY

In general, this disclosure is directed to techniques and devices for reading bit states of MRAM devices. In some examples, the memory system may include a control module. The control module may be configured to output a control signal to a first circuit and the second circuit. The first circuit may include an MRAM element in one of a high state or a low state and a first capacitor situated between the MRAM element and a first reference voltage. The resistance of the MRAM element defines a state of the MRAM element. The first circuit is configured to output a data signal once the first capacitor is charged. The second circuit may include a second resistor having a second resistance and a second capacitor situated between the second resistor and a second reference voltage. The second circuit is configured to output a reference signal once the second capacitor is charged. An arbiter is further included. The arbiter is configured to receive the data and reference signals from the first and second circuits, respectively, determining whether the data signal or the reference signal arrives first. Based on whether the data signal or the reference signal arrives first, the arbiter is configured to determine whether the MRAM package is in a high state or a low state. By including this race condition, the arbiter can determine whether the resistance in the first circuit, which is unknown, is higher or lower than the resistance of the second circuit, which is known. The arbiter can thereby determine the value of the MRAM element by comparing the data signal arrival time with the reference signal arrival time. Using a delay based read system and configuring multiple MRAM devices in series as a single storage element may increase the delta resistance of storage elements which allows the memory system to operate in environments at high temperatures where the delta resistance degradation of individual MRAM devices bits becomes significant.

In one example, the disclosure is directed to a memory system comprising: a control module configured to output a control signal; a first circuit configured to receive the control signal from the control module, the first circuit comprising: a magnetoresistive random access memory (MRAM) element in one of a high state or a low state, wherein the state of the MRAM element defines a resistance of the MRAM element; and a first capacitor situated after the MRAM element, wherein the first circuit is configured to output a data signal after the first capacitor is charged; a second circuit, wherein the link is configured to relay the control signal from the MRAM package to the second circuit, the second circuit comprising: a second resistor having a second resistance; and a second capacitor situated after the second resistor, wherein the second circuit is configured to output a reference signal after the second capacitor is charged; and an arbiter comprising a third circuit, wherein the arbiter is configured to: receive the data signal from the first circuit; receive the reference signal from the second circuit; determine whether the data signal or the reference signal arrived first; and determine whether the MRAM element of the first circuit is in a high state or a low state based at least in part on determining whether the data signal or the reference signal arrived at the arbiter first.

In another example, the disclosure is directed to a method of reading a magnetoresistive random access memory (MRAM) bit comprising: receiving, by a first circuit and a second circuit, a control signal from a control module, wherein the first circuit comprises an MRAM element in one of a high state or a low state, wherein the state of the MRAM element defines a resistance of the MRAM element, and a first capacitor situated between the MRAM element and a first reference voltage, and wherein the second circuit comprises a resistor having a second resistance and a second capacitor situated between the resistor and a second reference voltage; charging, by the first circuit, the first capacitor; charging, by the second circuit, the second capacitor; responsive to the first capacitor being charged, outputting, by the first circuit, a data signal; responsive to the second capacitor being charged, outputting, by the second circuit, a reference signal; receiving, by an arbiter, the data signal from the first circuit; receiving, by the arbiter, the reference signal from the second circuit; determining, by the arbiter, whether the data signal or the reference signal arrived first; and determining, by the arbiter, whether the MRAM package is in a high state or a low state based at least in part on determining whether the data signal or the reference signal arrived first.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
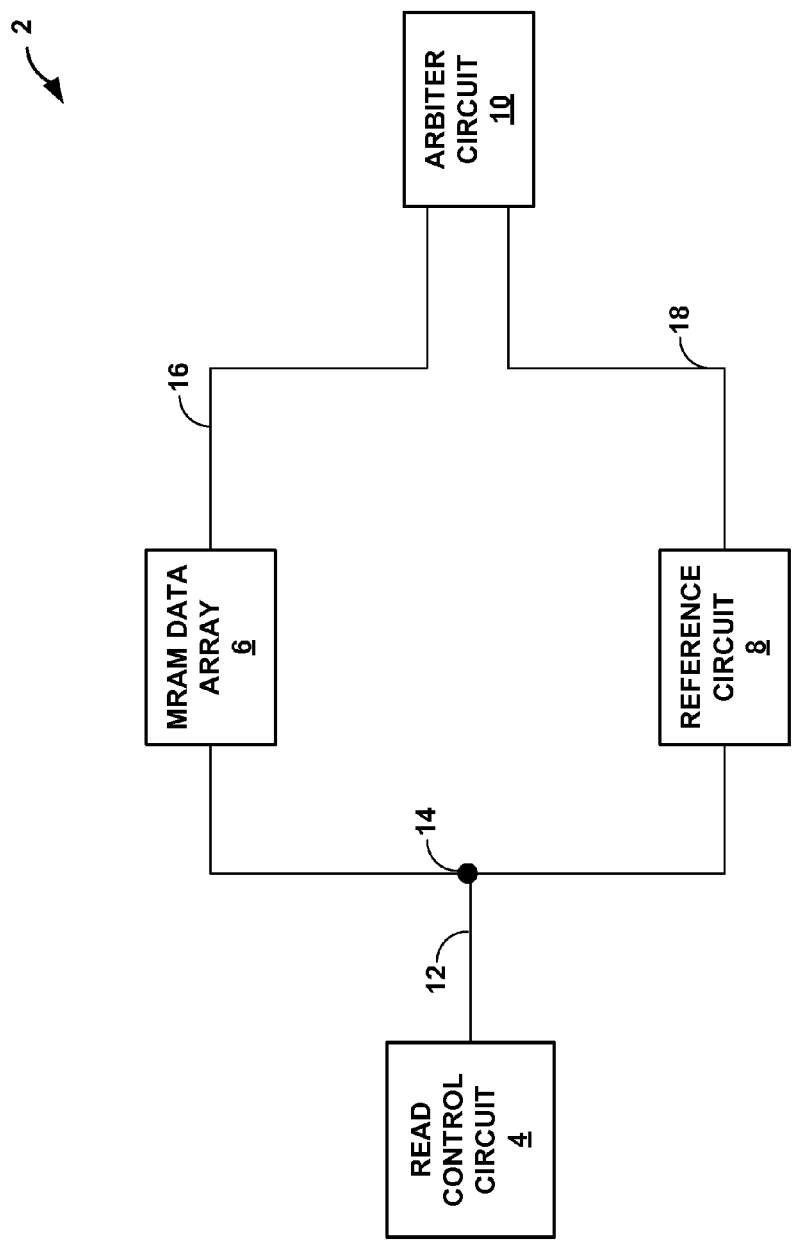
FIG. 1 is a block diagram illustrating an example memory system with a delay-based read system, in accordance with one or more aspects of this disclosure.

In general, this disclosure is directed to techniques and devices for reading bit states of MRAM devices. In some examples, a memory system may include a control module. The control module may be configured to output a control signal to a first circuit and the second circuit. The first circuit may include an MRAM element in one of a high state or a low state and a first capacitor connected in series to the MRAM element and a first reference voltage. In some examples, the MRAM element is a physical indication of an MRAM bit. The resistance of the MRAM element defines a state of the MRAM element. The first circuit is configured to output a data signal once the first capacitor is charged. The rate at which the capacitor charges is a function of the resistance of the MRAM element. As the resistance of the MRAM element changes, the rate at which the first capacitor chargers also changes. The second circuit may include a second resistor having a second resistance and a second capacitor connected in series to the second resistor and a second reference voltage. The second circuit is configured to output a reference signal once the second capacitor is charged. As the second resistor is fixed, the rate at which the second capacitor charges generally remains constant other than some minor variations caused by changes in temperature or other environmental variables. For the purposes of this disclosure, it should be recognized that "first" circuit, "second" circuit, etc. is not intended to imply discrete circuits, but may include portions of a common circuit, include common circuit components, etc.

An arbiter is further included in the system to receive the data and reference signals from the first and second circuits, respectively, and to determine whether the data signal or the reference signal arrives first. Based on whether the data signal or the reference signal arrives first, the arbiter is configured to determine whether the MRAM element is in a high state or a low state. When the resistance of the MRAM element is high, the first capacitor charges more slowly, and when the resistance of the MRAM element is low, the first capacitor charges more slowly. The second resistance may, for example, be chosen to be in between the high resistance of the MRAM element and the low resistance of the MRAM element. By including this race condition, the arbiter can determine whether the resistance in the first circuit, which is unknown, is higher or lower than the resistance of the second circuit, which is known. The arbiter can thereby determine the value of the MRAM element by comparing the data signal arrival time with the reference signal arrival time. Using a delay based read system and configuring multiple MRAM devices in series as a single storage element may increase the delta resistance of storage elements which allows the memory system to operate in environments at high temperatures where the delta resistance degradation of individual MRAM devices bits becomes significant.

Techniques according to this disclosure include stacking N MRAM elements in series, which serves as a single MRAM storage element. All N bits in the storage element may be written either be in a high or low state depending on the desired storage state. An additional set of 4×N reference bits may serve as the reference configuration. An example reference configuration may be 2×N devices in series with half of the device in a low state and the other half in the high state in parallel with a set of 2×N devices with half of the devices in a low state and the other half in the high state. This generates a resistance approximately half way between a high and low state, which may be used as the reference for comparison. Both the data and reference bits would be driven from a common input on one side of a data circuit and a reference circuit. On the other side of the data and reference circuits may be independent capacitors to form the RC delay. The data and reference circuits may each connect to an arbiter cell with a metastability filter, which performs the delay comparison. An example arbiter cell with metastability filtering may be a cross couple SR latch with series inverters on each output. When the input is low, the output of the device is low. On a rising input edge, the edge propagates through the data and reference circuits, reaching the arbiter at a time dependent on the resistance state of the data bit. If the data circuit is faster than the reference, the storage element may be in a low resistance state or a logic low. If the data circuit is slower than the reference circuit, then the storage element may be in a high resistance state or logic high. The arbiter may detect if the data leg delay is slower than the reference and signals accordingly, thus effectively reading the state of the stored data element.

MRAMs are designed in such a way that MRAMs may be used efficiently in high temperature applications, such as deep hole drilling, among other things. MRAMs are used in various applications, such as automobiles, where temperatures reach upwards of 125 degrees Celsius. By implementing techniques of this disclosure, MRAMs may be utilized in situations where temperatures routinely reach above 220 degrees Celsius, such as deep hole drilling. In such instances, access times may need to be <20 ns. With time and temperature, MRAM elements are subject to a reduction in magneto-resistance (MR) or a reduction in the delta resistance between a high state and a low state that worsens at elevated temperature and with time. This reduction in resistance delta can lead to a loss of read capability with existing read methods that place a voltage across the bit and then compare current differentials between a reference current and the data bit current being read. Additionally, existing MRAM element read methods tend to require >20 ns to sufficiently read the small current signals produced during the read process. A faster more reliable method for reading MRAM elements would enable high temperature applications with longer product life times.

In high temperature applications, degradation of the circuit occurs at a faster rate. By stacking bits, the resistance delta increases to compensate for the degradation. However, the higher resistance means that the current going through the circuit will be lower, thereby making the current more difficult to interpret. Therefore, the bits must be read in a different way rather than by analyzing the smaller current.

Techniques of this disclosure may include converting the MRAM storage element state to a delay and then compares the delay between the storage element being read to a reference delay to determine if it is in a high or low state. By utilizing delays rather than current, series stacking of bits may be utilized to form a single storage element to create a larger resistance delta between a high state and a low state, which is critical to read capability. Stacking N number of MRAM elements in series increases the delta resistance between a high and low state by N times. Increasing the delta resistance by stacking allows for the ability of MRAM to operate at higher temperatures for longer periods of time by increasing read margin to compensate for degrading magnetic resistance. Additionally, using the delay read method and series bit stacking, results in faster read times versus existing current sensing techniques.

FIG. 1 is a block diagram illustrating an example memory system 2 with a delay-based read system, in accordance with one or more aspects of this disclosure. Memory system 2 may include read control circuit 4. Read control circuit 4 may be configured to output a control signal. In some examples, the control signal is an electric charge that can flow through MRAM data array 6 and reference circuit 8 towards arbiter circuit 10.

Memory system 2 may also include MRAM data array 6 that may comprise a plurality of MRAM cells, each of which is configured to be in either a high state or a low state. MRAM data array 6 uses magnetic storage elements in order to store data. The magnetic storage elements of MRAM data array 6 may be formed from two ferromagnetic plates, each of which may hold a magnetic field, separated by an insulating layer. One of the two plates is a permanent magnetic plate set to a particular polarity, while the other magnetic plate's field can be changed to match that of an external field to store memory. Due to the magnetic tunnel effect, the electrical resistance of the cell may change due to the orientation of the fields in the two magnetic plates. By measuring the resulting current, the resistance inside any particular cell can be determined, and from this the polarity of the writable plate. In some examples, if the two plates have the same polarity, the storage element is in a high state, meaning the storage element has a value of 1. Alternatively, if the two plates are of opposite polarity, the storage element is in a low state, meaning the storage element has a value of 0. While this is one example of a possible configuration of an MRAM package, any configuration of an MRAM package may be used with techniques disclosed herein.

Read control circuit 4 may be connected to MRAM data array 6 and reference circuit 8 by link 12. Link 12 may be a wire configured to relay a control signal from Read control circuit 4 to MRAM data array 6 and reference circuit 8. The control signal may an electric charge that can flow through MRAM data array 6 and reference circuit 8 towards arbiter circuit 10. Link 12 may be made of any material suitable for a wire in a circuit, such as nickel, nickel-plated or nickel-clad copper, tin-plated copper, silver-plated copper, high strength copper alloys, or any other material that can relay a control signal, especially in a high-temperature environment. Memory system 2 may further include links 16 and 18. Link 16 may be configured to relay a data signal from MRAM data array 6 to arbiter circuit 10, and may be made of any material that is also suitable for making link 12. Link 18 may be configured to relay a reference signal from reference circuit 8 to arbiter circuit 10, and may be made of any material that is also suitable for making link 12. Node 14 represents a split in link 12, allowing a control signal to go to both MRAM data array 6 and reference circuit 8.

In general, reference circuit 8 is configured to receive the control signal from read control circuit 4. Reference circuit 8 may comprise at least a resistor and a capacitor situated between the resistor and a reference voltage. As described below, an MRAM element in MRAM data array 6 may have a high resistance or a low resistance based on whether the MRAM element is in a high state or a low state, respectively. The resistor of reference circuit 8 may have a resistance that is approximately equal to the average of the two possible resistances of the MRAM element of MRAM data array 6. As such, generally, regardless of whether MRAM data array 6 is in a low state or a high state, control signal will consistently be delayed the same amount of time as the control signal goes across the resistor to charge the capacitor. Once the capacitor is charged, reference circuit 8 is configured to output a reference signal to be received by arbiter circuit 10 as voltage flowing through reference circuit 8 and across link 18.

In general, MRAM data array 6 is configured to receive the control signal from read control circuit 4. MRAM data array 6 may comprise at least a resistor and a capacitor situated between the resistor and a reference voltage. In some examples, the resistor in MRAM data array 6 may have a variable resistance depending on the state of one or more MRAM elements in MRAM data array 6. When the capacitor is charged, MRAM data array 6 may output a data signal to arbiter circuit 10 as voltage flowing through MRAM data array 6 and across link 16. Generally, the time it takes for the first capacitor to charge and for MRAM data array 6 to output the data signal via link 16 to arbiter circuit 10 indicates whether the one or more MRAM elements in MRAM data array 6 are in a high state or a low state. For instance, if the one or more MRAM elements in MRAM data array 6 are in a high state, then the resistance of MRAM data array 6 will be larger, meaning the control signal will be delayed longer within MRAM data array 6 and MRAM data array 6 may output the data signal after reference circuit 8 outputs the reference signal. Conversely, if the one or more MRAM elements in MRAM data array 6 are in a low state, then the resistance of MRAM data array 6 will be smaller, meaning the control signal will be less delayed within MRAM data array 6 and MRAM data array 6 may output the data signal before reference circuit 8 outputs the reference signal. In other words, the certainty of how long it takes reference circuit 8 to output the reference signal allows the output time of the data signal from MRAM data array 6 to indicate what state one or more MRAM elements of MRAM data array 6 may be in.

In general, arbiter circuit 10 is configured to receive the data signal from MRAM data array 6 and the reference signal from reference circuit 8. Arbiter circuit 10 is configured to determine whether the data signal or the reference signal arrives first, and further determine the state of one or more MRAM elements of MRAM data array 6 based on which signal arrives first. In other words, arbiter circuit 10 uses a race condition to ultimately determine whether one or more MRAM elements of MRAM data array 6 are in a high state or a low state. As described above, reference circuit 8 will generally output the reference signal consistently after a certain amount of time has passed. MRAM data array 6 will output the data signal after a varying amount of time has passed, depending on whether one or more MRAM elements of MRAM data array 6 are in a high state or a low state. If the one or more MRAM elements of MRAM data array 6 are in a high state, then MRAM data array 6 may take longer to output the data signal, meaning that arbiter circuit 10 may receive the reference signal first. Based on this sequence of events, arbiter circuit 10 may determine that the one or more MRAM elements of MRAM data array 6 are in a high state, meaning that the one or more MRAM element have a value of 1. Conversely, if the one or more MRAM elements of MRAM data array 6 are in a low state, then MRAM data array 6 may take less time to output the data signal, meaning that arbiter circuit 10 may receive the data signal first. Based on this sequence of events, arbiter circuit 10 may determine that the one or more MRAM elements of MRAM data array 6 are in a low state, meaning that the one or more MRAM elements have a value of 0. To accomplish this, arbiter circuit 10 may be any device or configuration of a circuit that can receive a data signal and a reference signal and determine which signal was received first. For example, arbiter circuit 10 may be a set-reset latch (SR latch) or a system of counters.

In accordance with one or more techniques of this disclosure, memory system 2 may execute a method of reading an MRAM element. MRAM data array 6 and reference circuit 8 may receive, via link 12, a control signal from read control circuit 4. MRAM data array 6 may comprise a MRAM element and a first capacitor situated between the MRAM element and a first reference voltage. The MRAM element may be in one of a high state or a low state, and that state defines a first resistance of the MRAM data array 6. Reference circuit 8 may comprise a resistor having a second resistance and a second capacitor situated between the resistor and a second reference voltage. MRAM data array 6 may charge the first capacitor, and reference circuit 8 may charge the second capacitor. Responsive to the first capacitor being charged, MRAM data array 6 may output a data signal. Responsive to the second capacitor being charged, reference circuit 8 may output a reference signal. Arbiter circuit 10 may receive the data signal from MRAM data array 6 and may receive the reference signal from reference circuit 8. Arbiter circuit 10 may determine whether the data signal or the reference signal arrived first. Arbiter circuit 10 may then, based at least in part on determining whether the data signal or the reference signal arrived first, determine whether the MRAM element is in a high state or a low state.

Figure 2A:
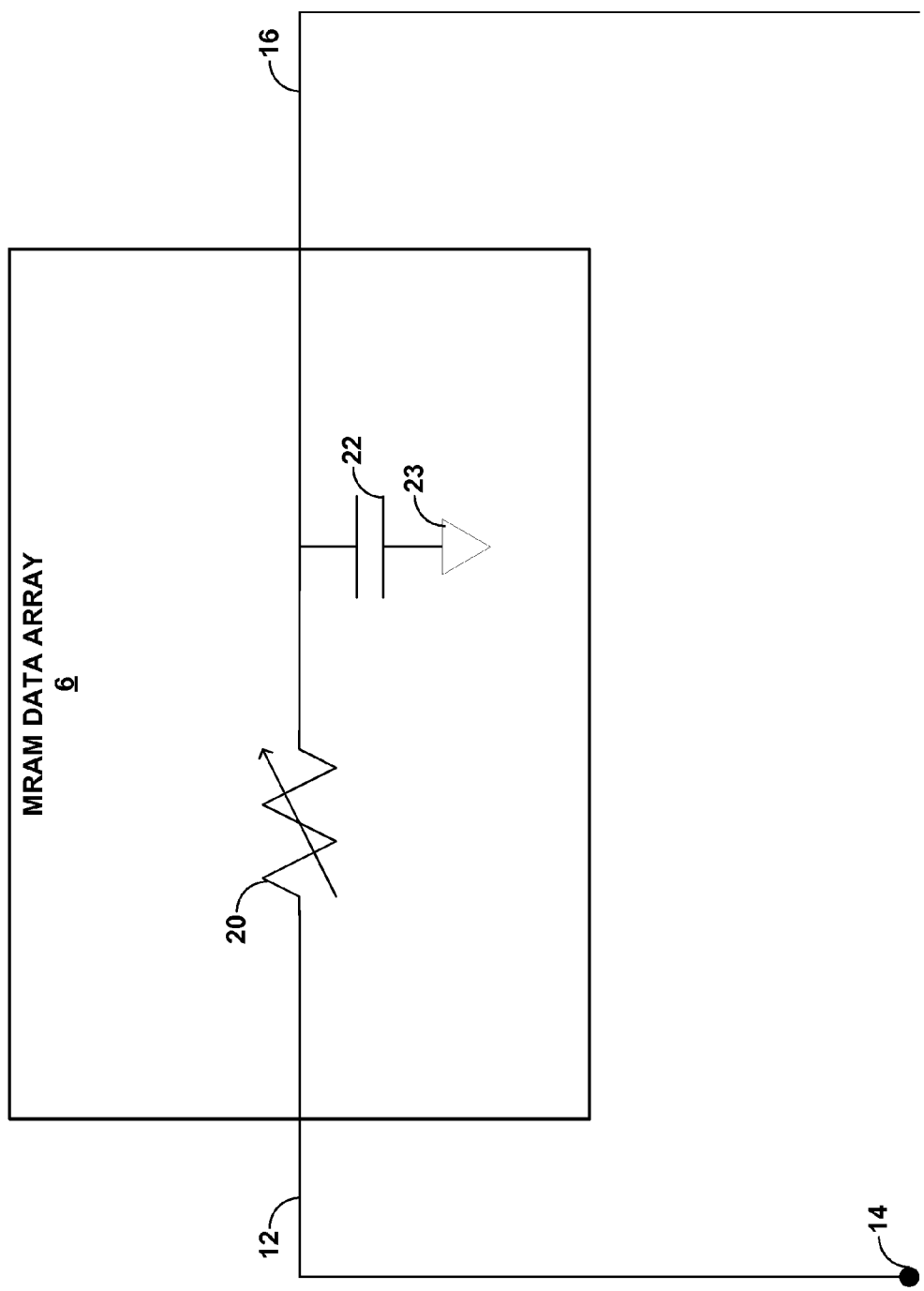
FIGS. 2A-2D are conceptual and schematic diagrams illustrating example MRAM data arrays of the delay-based read system, in accordance with one or more aspects of this disclosure.
Figure 2B:
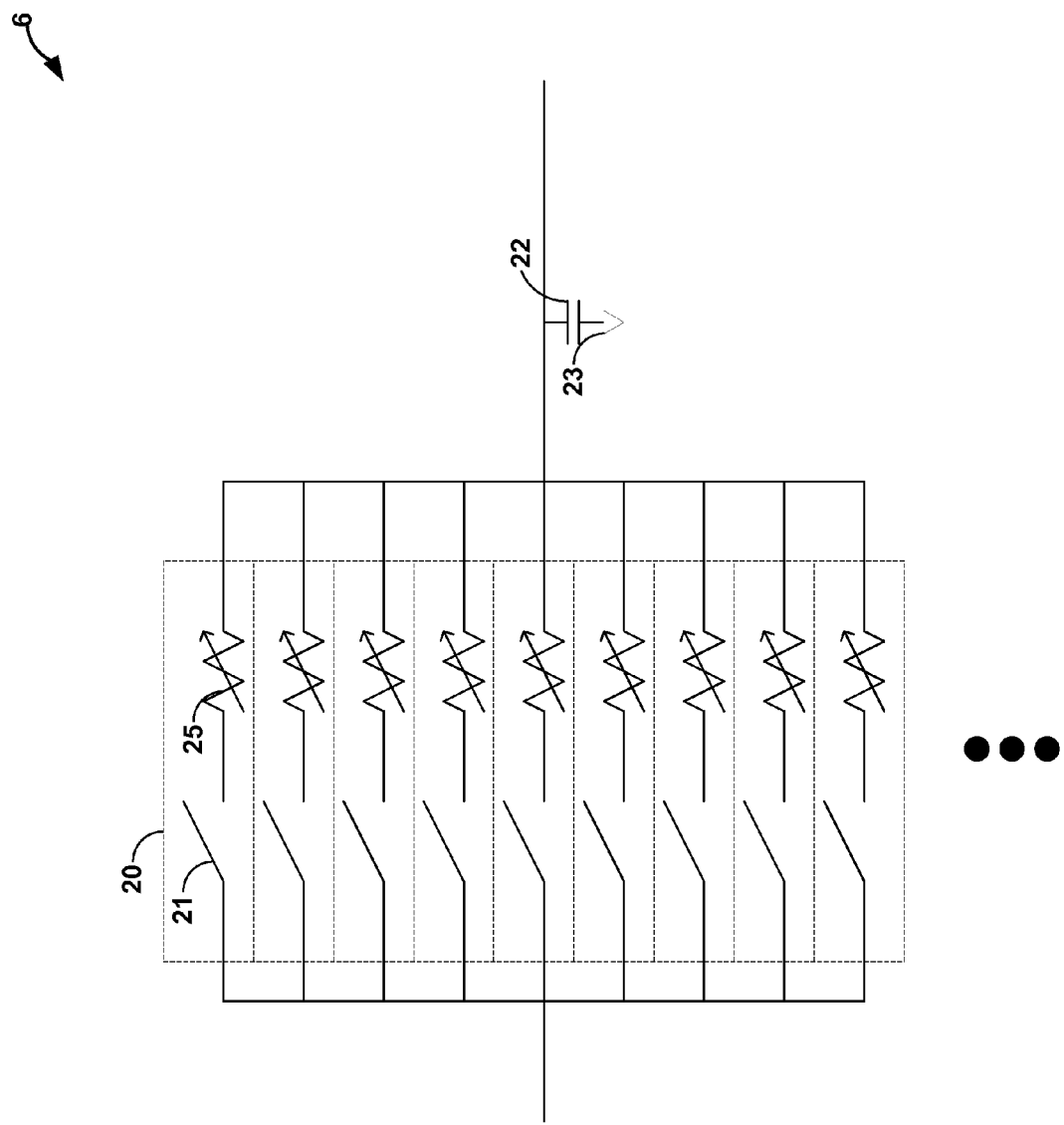
Figure 2C:
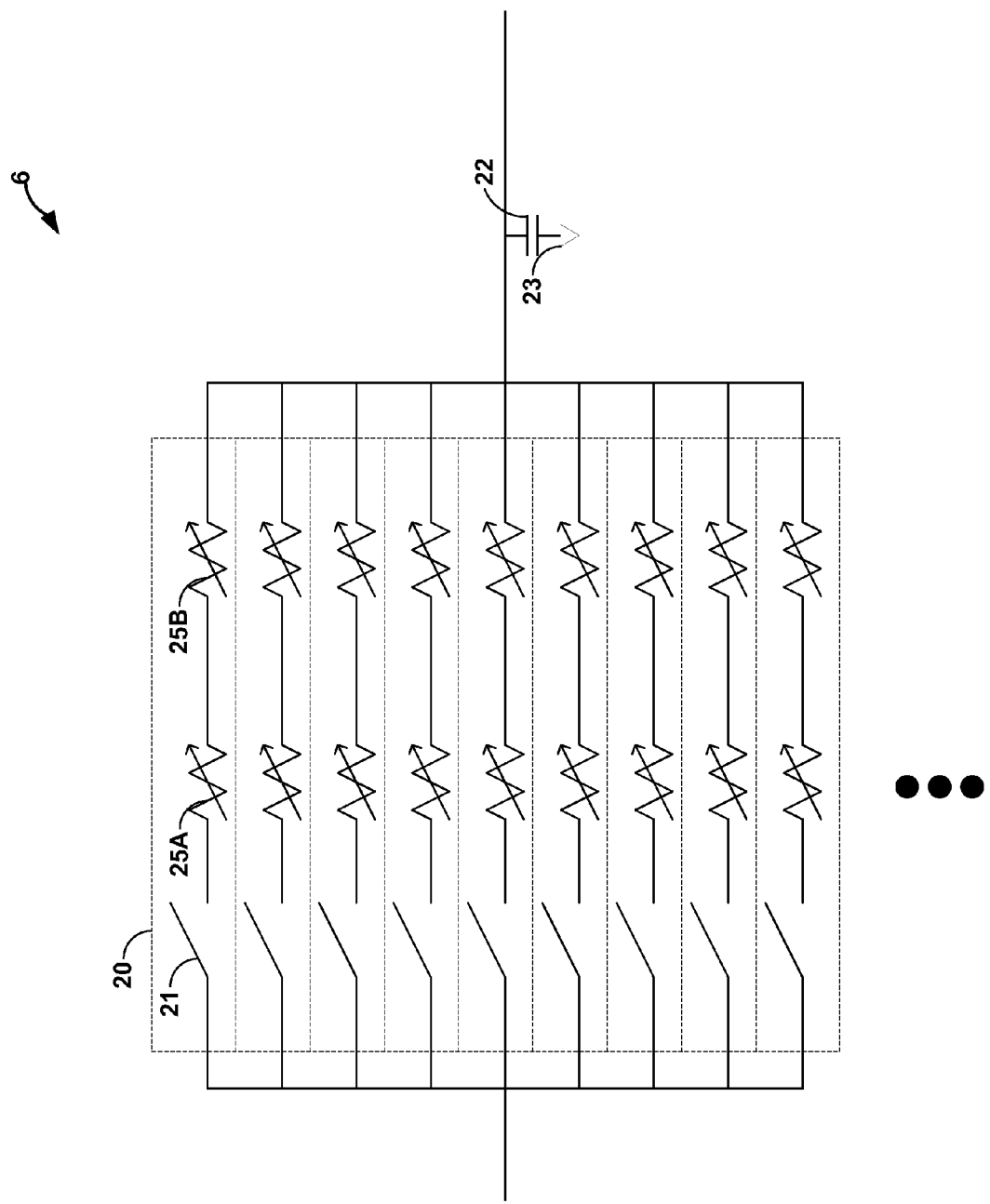
Figure 2D:
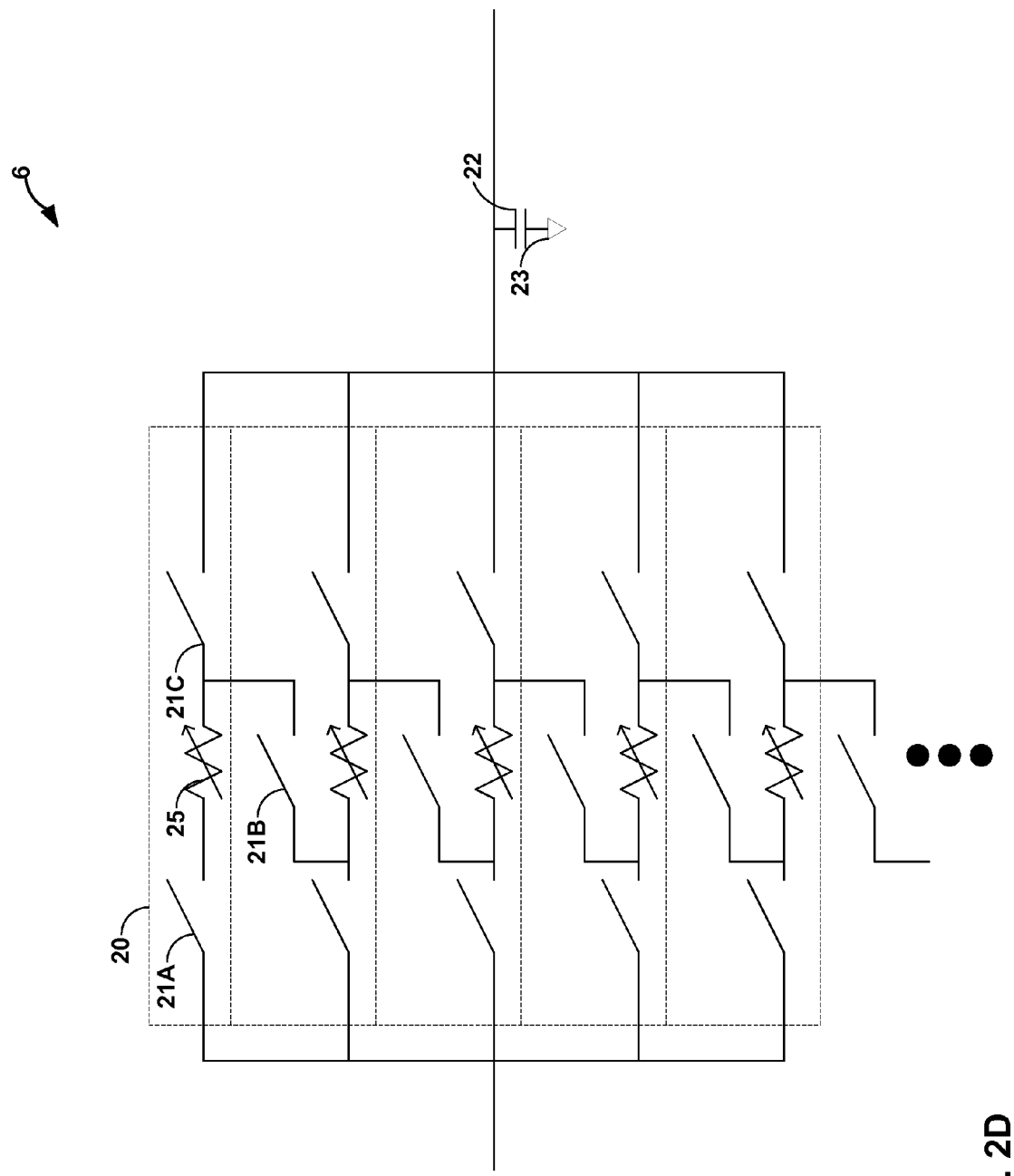

FIGS. 2A-2D are conceptual and schematic diagrams illustrating example MRAM data arrays of the delay-based read system, in accordance with one or more aspects of this disclosure. FIG. 2A shows a single MRAM element. FIG. 2B shows a system of switches which allows the controller to dynamically configure the array to choose an MRAM element that will be read. FIG. 2C shows a system of switches which allows the controller to dynamically configure which series of MRAM elements will be read, allowing for bit stacking. FIG. 2D shows a system of switches which allows the controller to dynamically configure the array to choose a series of N MRAM elements that will be read. As described above, node 14 splits link 12 to connect to MRAM data array 6. Link 12 relays the control signal to MRAM data array 6 from a control module, such as read control circuit 4.

In the example of FIG. 2A, MRAM data array 6 includes MRAM element 20, capacitor 22, and reference voltage 23, with one terminal of capacitor 22 connected to MRAM element 20 and the other terminal of capacitor 22 connected to the reference voltage 23. Reference voltage 23 may, for example, be a ground voltage. In some examples, such as the example of FIG. 2A, MRAM element 20 may have a variable resistance based on whether MRAM element 20 is in a high state or a low state. For instance, if MRAM element 20 is in a high state, MRAM element 20 may have a higher resistance. Alternatively, if MRAM element 20 is in a low state, MRAM element 20 may have a lower resistance. In other examples, this convention may be reversed, such that a low state has a higher resistance and a high state has a lower resistance. Although shown in FIG. 2A as a single MRAM element, in other examples, MRAM element 20 may be a plurality of MRAM elements in series, with capacitor 22 being situated between the final MRAM element within MRAM data array 6 and reference voltage 23.

Once the control signal passes through MRAM element 20, the control signal charges capacitor 22. When capacitor 22 is uncharged, there is no potential across capacitor 22 and no voltage on link 16. As capacitor 22 charges, the voltage across capacitor 22 increases, causing the voltage at link 16 to increase. The time constant for the RC circuit of MRAM data array 6 (i.e. MRAM element 20 and capacitor 22), which is a measure of how long it takes capacitor 22 to charge, corresponds to the product of the resistance of MRAM element 20 (measured in ohms) and the capacitance of capacitor 22 (measured in farads). Thus, a higher resistance for MRAM element 20 corresponds to a higher time constant for the RC circuit, and a lower resistance for MRAM element 20 corresponds to a lower time constant for the RC circuit. In other words, capacitor 22 charges more quickly when MRAM element 20 has a low resistance than when capacitor 22 has a high resistance. Once capacitor 22 is charged, there is a voltage across capacitor 22, meaning there is a voltage at link 16, or a data signal, which is input to an arbiter, such as arbiter circuit 10.

FIG. 2B shows a system of switches which allows the controller to dynamically configure the array to choose an MRAM element that will be read. MRAM data array 6 of FIG. 2B includes capacitor 22 and reference voltage 23, each of which have a similar function as the corresponding parts of FIG. 2A. For example, capacitor 22 is charged by the control signal after it passes through MRAM element system 20 and is situated between MRAM element system 20 and reference voltage 23. Once capacitor 22 is charged, there is a voltage across capacitor 22, meaning there is a voltage at link 16, or a data signal, which is input to an arbiter, such as arbiter circuit 10.

In the example of FIG. 2B, MRAM element system 20 includes a plurality of switches 21 and a plurality of MRAM elements 25, with each switch being associated with a respective MRAM element. In this way, a memory system, such as memory system 2 of FIG. 1, may read any of MRAM elements 25. A control signal received by MRAM data array 6 may include an indication of which MRAM element of the plurality of MRAM elements 25 is to be read. As such, a switch of the plurality of switches 21 that is associated with the MRAM element of the plurality of MRAM elements 25 that is to be read will close, completing the circuit inside MRAM data array 6. Each of the MRAM elements in the plurality of MRAM elements 25 may be in a state independent of any other MRAM element in the plurality of MRAM elements 25. In this way, each of the MRAM elements in the plurality of MRAM elements 25 may be read as a standalone MRAM element using techniques described herein.

FIG. 2C shows a system of switches which allows the controller to dynamically configure which series of MRAM elements will be read, allowing for bit stacking. MRAM data array 6 of FIG. 2C includes capacitor 22 and reference voltage 23, each of which have a similar function as the corresponding parts of FIG. 2A. For example, capacitor 22 is charged by the control signal after it passes through MRAM element system 20 and is situated between MRAM element system 20 and reference voltage 23. Once capacitor 22 is charged, there is a voltage across capacitor 22, meaning there is a voltage at link 16, or a data signal, which is input to an arbiter, such as arbiter circuit 10.

In the example of FIG. 2C, MRAM element system 20 includes a plurality of switches 21, a first plurality of MRAM elements 25A, and a second plurality of MRAM elements 25B, with each switch being associated with a respective group of MRAM elements. In this way, a memory system, such as memory system 2 of FIG. 1, may read any pair of MRAM elements consisting of an MRAM element in the plurality of MRAM elements 25A and the corresponding MRAM element in the plurality of MRAM elements 25B. A control signal received by MRAM data array 6 may include an indication of which pair of MRAM elements of the first and second plurality of MRAM elements 25A-25B is to be read. As such, a switch of the plurality of switches 21 that is associated with the pair of MRAM elements of the first and second plurality of MRAM elements 25A-25B that is to be read will close, completing the circuit inside MRAM data array 6. Each pair of MRAM elements in the first and second plurality of MRAM elements 25A-25B may be in a state independent of any other pair of MRAM elements in the first and second plurality of MRAM elements 25A-25B. In this way, each of the pairs of MRAM elements in the first and second plurality of MRAM elements 25A-25B may be read as a standalone MRAM element using techniques described herein. Further, the corresponding MRAM elements in the first and second plurality of MRAM elements 25A-25B that make up a pair of MRAM elements (i.e., the MRAM elements that are read when a single switch closes to complete a circuit) have the same state in order to keep the timing of the memory system intact. In other words, the MRAM elements may be stacked so that multiple MRAM elements in the same state may be read simultaneously. While the example of FIG. 2C shows only two MRAM elements in each group, other examples may include much larger groups of MRAM elements.

In high temperature applications, degradation of the circuit occurs at a faster rate. By stacking bits, the resistance delta increases to compensate for the degradation. However, the higher resistance means that the current going through the circuit will be lower, thereby making the current more difficult to interpret. Therefore, the bits must be read in a different way rather than by analyzing the smaller current.

FIG. 2D shows a system of switches which allows the controller to dynamically configure the array to choose a series of N MRAM elements that will be read. MRAM data array 6 of FIG. 2D includes capacitor 22 and reference voltage 23, each of which have a similar function as the corresponding parts of FIG. 2A. For example, capacitor 22 is charged by the control signal after it passes through MRAM element system 20 and is situated between MRAM element system 20 and reference voltage 23. Once capacitor 22 is charged, there is a voltage across capacitor 22, meaning there is a voltage at link 16, or a data signal, which is input to an arbiter, such as arbiter circuit 10.

In the example of FIG. 2C, MRAM element system 20 includes a plurality of MRAM elements 25, a first plurality of switches 21A situated before a corresponding MRAM element of the plurality of MRAM elements 25, a second plurality of switches 21B situated after a corresponding MRAM element of the plurality of MRAM elements 25 that closes a link between a location directly after the corresponding MRAM element and a location directly before an MRAM element below the corresponding MRAM element, and a third plurality of switches 21C situated after the corresponding MRAM element of the plurality of MRAM elements 25. With this arrangement, various combinations of switches may close to allow a dynamic combination of MRAM elements from the plurality of MRAM elements 25 to be read in series, stacking N bits based on the control signal.

For example, a switch in the first plurality of switches 21A corresponding to a first MRAM element of the plurality of MRAM elements 25 that is to be read in series may close, allowing the control signal to flow through said MRAM element. In one example, say that three MRAM elements are to be read in series. The switch in the third plurality of switches 21C corresponding to the first MRAM element will remain open, and the switch in the second plurality of switches 21B corresponding to the first MRAM element will close, linking a location after the first MRAM element to a location before a second MRAM element in the plurality of MRAM elements 25 located directly below the first MRAM element. Further, the switch in the third plurality of switches 21C corresponding to the second MRAM element will remain open, and the switch in the second plurality of switches 21B corresponding to the second MRAM element will close, linking a location after the second MRAM element to a location before a third MRAM element in the plurality of MRAM elements 25 located directly below the second MRAM element. Finally, a switch in the third plurality of switches 21C corresponding to the third MRAM element will close, and the switch in the second plurality of switches 21B corresponding to the third MRAM element will remain open. This will link the third MRAM element to capacitor 22, with the control signal flowing through each of the first, second, and third MRAM element in series. In other examples, more or less MRAM elements may be included in the series. A switch in the first plurality of switches 21A corresponding to the first MRAM element in the series will close, a switch in the third plurality of switches 21C corresponding to the final MRAM element in the series will close, and all switches in the second plurality of switches 21B between the first MRAM element and the final MRAM element will close, creating a dynamic series of MRAM elements to be read in the memory system.

In high temperature applications, degradation of the circuit occurs at a faster rate. By stacking bits, the resistance delta increases to compensate for the degradation. However, the higher resistance means that the current going through the circuit will be lower, thereby making the current more difficult to interpret. Therefore, the bits must be read in a different way rather than by analyzing the smaller current.

Figure 3A:
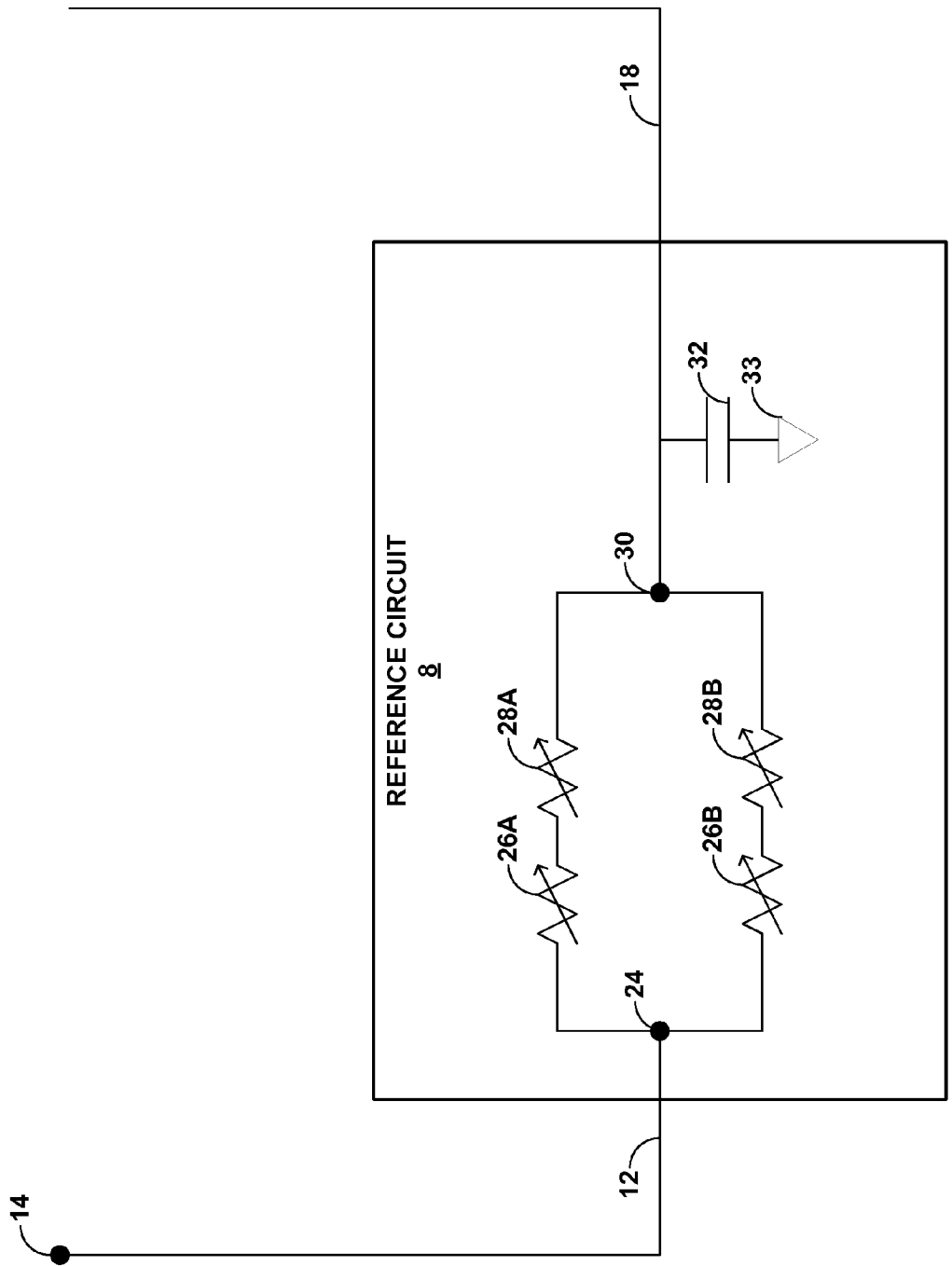
FIGS. 3A-3B are conceptual and schematic diagrams illustrating example reference circuits of the delay-based read system, in accordance with one or more aspects of this disclosure.
Figure 3B:
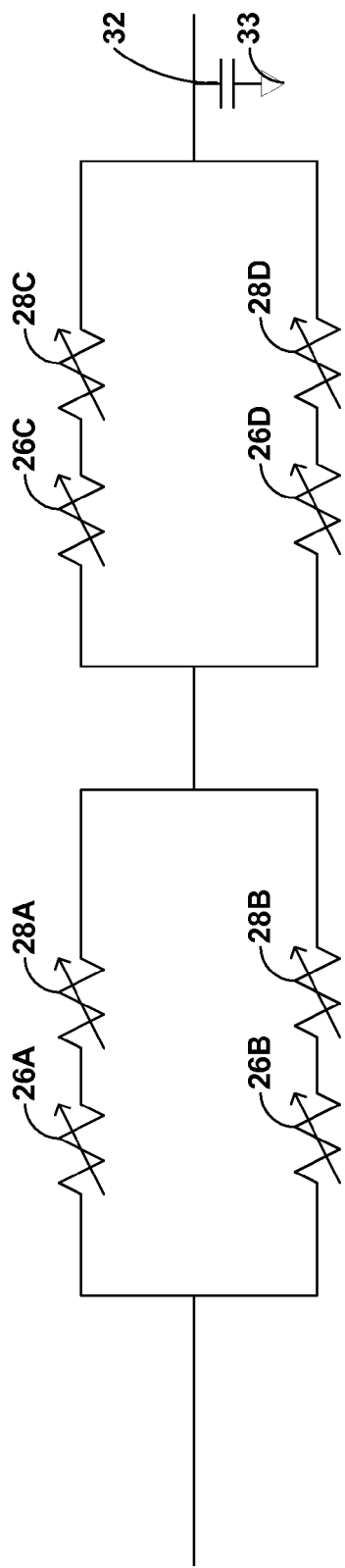

FIGS. 3A-3B are conceptual and schematic diagrams illustrating example reference circuits of the delay-based read system, in accordance with one or more aspects of this disclosure. The reference circuit contains multiple MRAM devices configured in known states to create a resistance whose value is the average of a storage element in the high state and low state. As described above, node 14 splits link 12 to connect to reference circuit 8. Link 12 relays the control signal to reference circuit 8 from a control module, such as read control circuit 4.

In the example of FIG. 3, node 24 represents a split in link 12 to form a parallel resistor comprising a first high reference resistor 26A and a first low reference resistor 28A in parallel with a second high reference resistor 26B and a second low reference resistor 28B, while node 30 represents a reconnection of the parallel links. Reference circuit 8 also includes capacitor 32 and reference voltage 33, with one terminal of capacitor 32 connected to the parallel resistors and the other terminal of capacitor 32 connected to the reference voltage 33. Reference voltage 33 may, for example, be a ground voltage. High reference resistors 26A and 26B may have a resistance similar to the resistance of MRAM element 20 of FIG. 1 when MRAM element 20 is in a high state, and low reference resistors 28A and 28B may have a resistance similar to the resistance of MRAM element 20 when MRAM element 20 is in a low state. By placing these four resistances in parallel, the overall resistance of the parallel circuit will be an average of the two resistances. In other words, when MRAM element 20 is in a low state, MRAM element 20 will have a smaller resistance than the resistance made up of high reference resistors 26A and 26B and low reference resistors 28A and 28B. In such a case, capacitor 22 will charge before capacitor 32 is charged, meaning MRAM data array 6 will output a data signal before reference circuit 8 outputs a reference signal via link 18. Alternatively, when MRAM element 20 is in a high state, MRAM element 20 will have a larger resistance than the resistance made up of high reference resistors 26A and 26B and low reference resistors 28A and 28B. In such a case, capacitor 32 will charge before capacitor 22 is charged, meaning reference circuit 8 will output a reference signal via link 18 before MRAM data array 6 will output a data signal. In some examples, high reference resistors 26A and 26B and low reference resistors 28A and 28B may be wired resistors with a resistance equal to what the MRAM elements would have for a resistance. In other examples, high reference resistors 26A and 26B may be MRAM elements in a known high state and low reference resistors 28A and 28B may be MRAM elements in a known low state, equalizing the resistances with the MRAM elements in MRAM data array 6.

When capacitor 32 is uncharged, there is no potential across capacitor 32 and no voltage on link 18. As capacitor 32 charges, the voltage across capacitor 32 increases, causing the voltage at link 18 to increase. The time constant for the RC circuit of reference circuit 8 (i.e. resistors 26 and 28 and capacitor 32), which is a measure of how long it takes capacitor 32 to charge, corresponds to the product of the resistance of resistors 26 and 28 (measured in ohms) and the capacitance of capacitor 32 (measured in farads). Since resistors 26 and 28 are in parallel, the resistance used in the above calculation is the average of the resistance of resistors 26 and 28. Since the resistance of reference circuit 8 is relatively fixed, the time constant for the RC circuit will remain relatively constant. This allows the varying time constant of the data circuit to have a baseline comparison for determinations made by arbiter circuit 10. Once capacitor 32 is charged, there is a voltage across capacitor 32, meaning there is a voltage at link 18, or a reference signal, which is input to an arbiter, such as arbiter circuit 10.

Although shown as two single resistors in parallel, the resistor of reference circuit 8 may have many different configurations. For instance, each of high reference resistor 26 and low reference resistor 28 may be a plurality of reference resistors in series, with the plurality of high reference resistors being a series in parallel with a series of the plurality of low reference resistors. In other examples, rather than being resistors in parallel, reference circuit 8 may only include a single resistor with a resistance equal to an average of the possible resistances of MRAM element 20 (i.e., the high resistance when MRAM element 20 is in a high state and the low resistance when MRAM element 20 is in a low state). In still other examples, reference circuit 8 may include a single plurality of resistors in a series. In any case, the total resistance of reference circuit 8 is approximately equal to an average of the possible resistances of MRAM element 20 in MRAM data array 6. For instance, the total resistance of reference circuit 8 may be within +/−10% of the average of the possible resistances of MRAM element 20 in MRAM data array 6.

For example, FIG. 3B shows a second possible configuration. Similar to stacking MRAM elements in MRAM data array 6, the resistances in reference circuit 8 may be stacked. In the example of FIG. 3B, reference circuit 8 includes a second instance of the group of four resistances. One instance includes the pair consisting of high reference resistance 26A in series with low reference resistance 28A in parallel with the pair consisting of high reference resistance 26B in series with low reference resistance 28B. A second instance includes the pair consisting of high reference resistance 26C in series with low reference resistance 28C in parallel with the pair consisting of high reference resistance 26D in series with low reference resistance 28D, the second instance being in series with the first instance. In some examples, when MRAM data array 6 has a static amount of MRAM elements, such as N MRAM elements, reference circuit 8 may have N instances of the four-resistance circuit shown in FIGS. 3A and 3B. In other words, for every N MRAM element in series in MRAM data array 6, reference circuit 8 may have 4×N resistances.

Figure 4A:
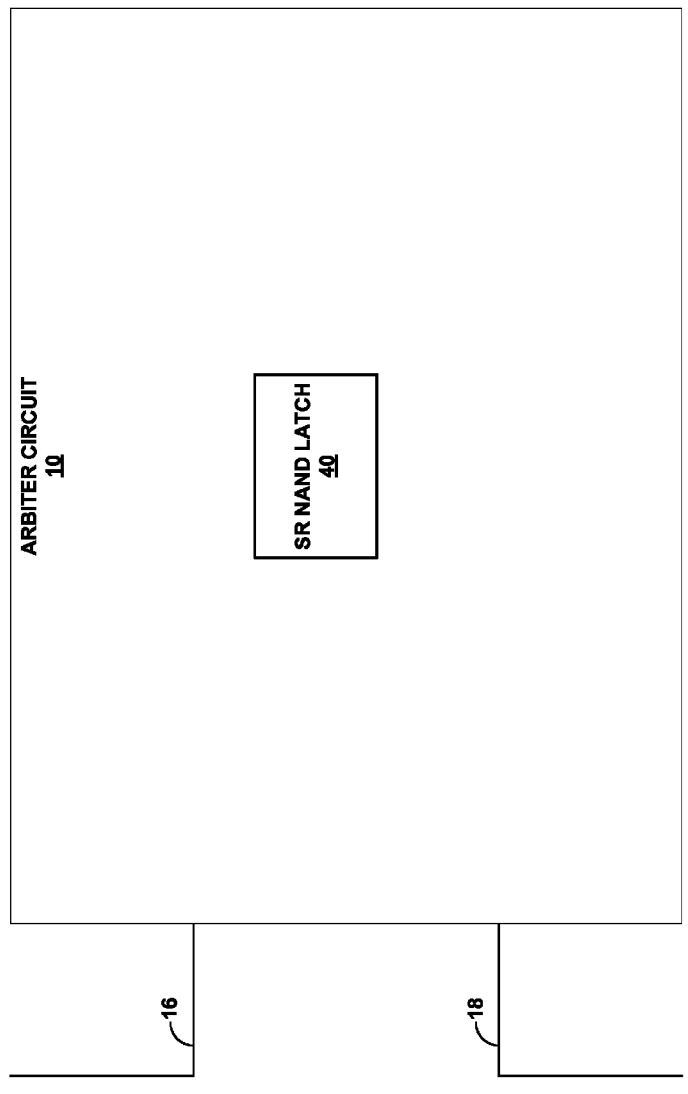
FIGS. 4A-4B are conceptual and schematic diagrams illustrating example arbiter circuits of the delay-based read system, in accordance with one or more aspects of this disclosure.
Figure 4B:
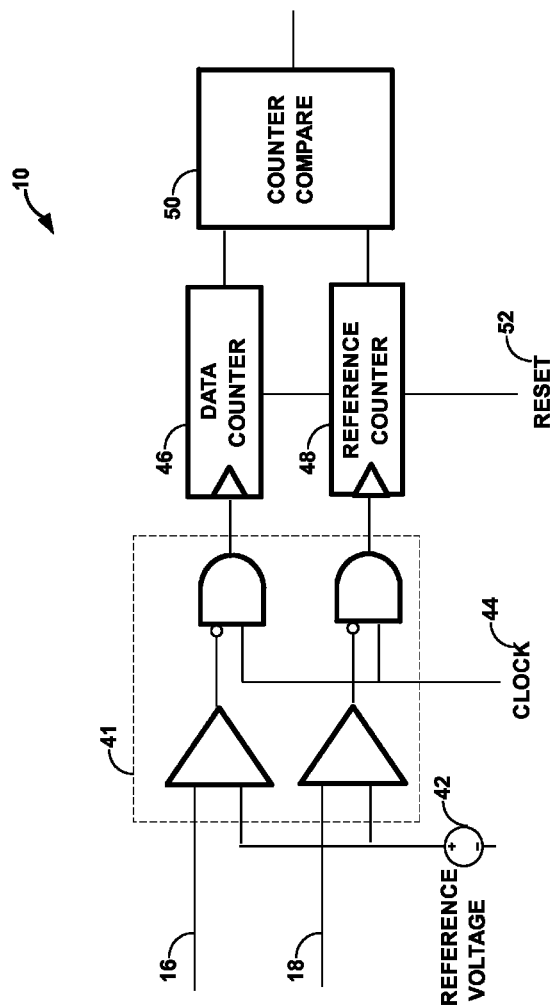

FIGS. 4A-4B are conceptual and schematic diagrams illustrating example arbiter circuits of the delay-based read system, in accordance with one or more aspects of this disclosure. In the example of FIG. 4A, arbiter circuit 10 is depicted as a set-reset NAND latch (SR NAND latch) 40. Using the SR NAND latch 40, arbiter circuit 10 may receive inputs from link 16, in the form of the data signal from MRAM data array 6, and from link 18, in the form of the reference signal from reference circuit 8. SR NAND latch 40 may be configured to determine whether the data signal from MRAM data array 6 or the reference signal from reference circuit 8 arrives first. If the data signal from MRAM data array 6 arrives first, SR NAND latch 40 may determine that the one or more MRAM elements being read in MRAM data array 6 are in a low state and have a value of 0. Conversely, if the signal from reference circuit 8 arrives first, SR NAND latch 40 may determine that the one or more MRAM elements being read in MRAM data array 6 are in a high state and have a value of 1.

In another example, arbiter circuit 10 may be similar to the circuit shown in FIG. 4B. In this example, arbiter circuit 10 includes reference voltage 42, clock 44, data counter 46, reference circuit 48, counter compare module 50, and reset 52. Voltage comparators 41 monitor the voltage on the capacitors for the data signal from MRAM data array 6 over link 16 and the reference signal from reference circuit 8 over link 18. When the data voltage is below the reference voltage, voltage comparators 41 output a 0 and clock 44 is allowed to propagate to counters 46 and 48. When the data voltage is above the reference voltage, voltage comparators 41 output a 1 and clock 44 is stopped to the counters 46 and 48. Counters 46 and 48 are compared at counter compare module 50. If data counter 46 is less than reference counter 48, counter compare module indicates the read data bit was a low resistance and the value of the MRAM element in MRAM data array 6 is a 0. If data counter 46 is greater than reference counter 48, counter compare module indicates the read data was a high resistance and the value of the MRAM element in MRAM data array 6 is a 1.

In any case, arbiter circuit 10 can be any device capable of receiving both a data signal from MRAM data array 6 and a reference signal from reference circuit 8. Arbiter circuit 10 may further b any device capable of determining whether the data signal or the reference signal arrives first, determining whether the MRAM element of MRAM data array 6 is in a high state or a low state based at least in part on determining whether the data signal or the reference signal arrived at the arbiter first.

Figure 5:
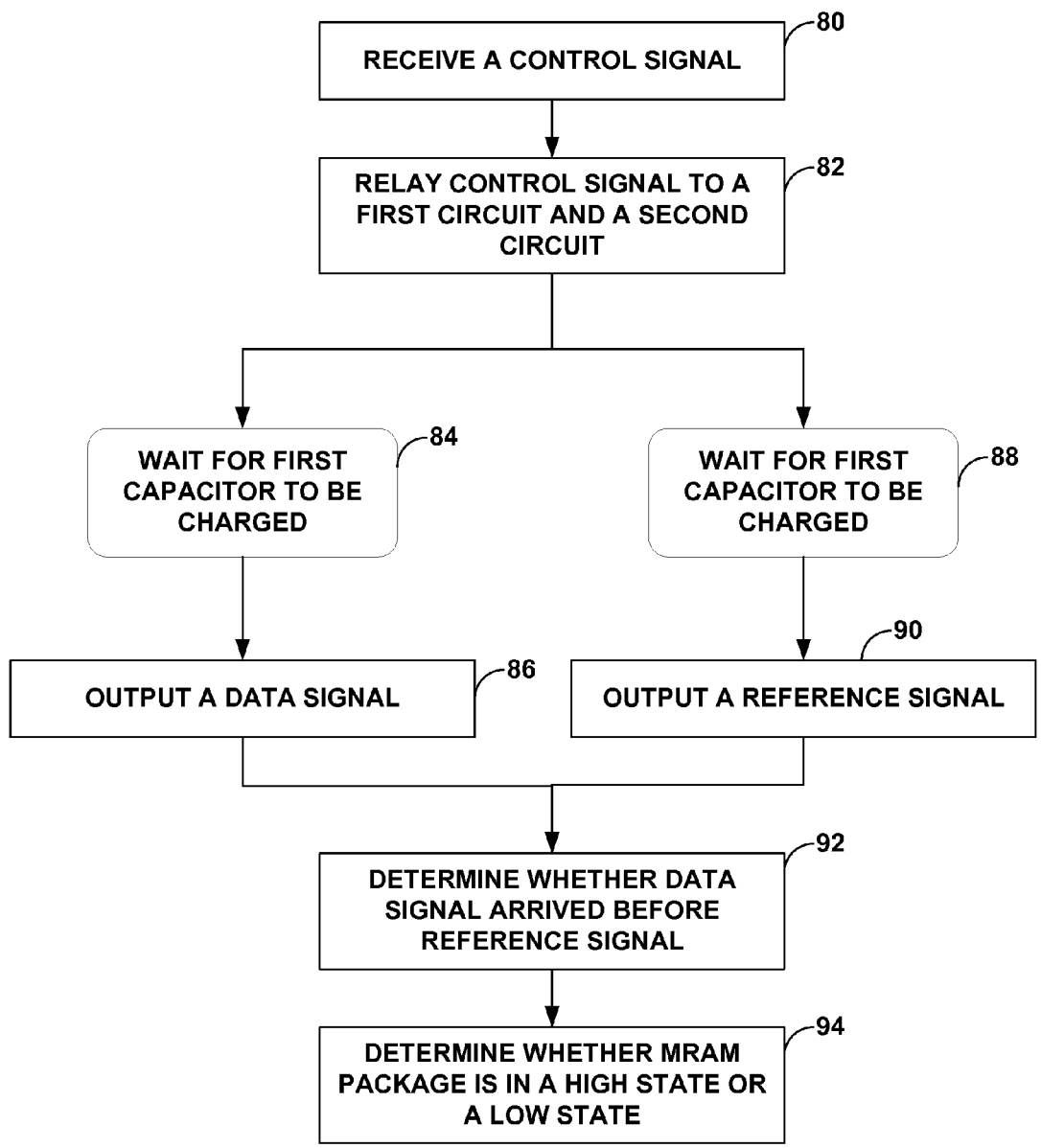
FIG. 5 is a flow diagram illustrating an example method of reading an MRAM element, in accordance with one or more aspects of this disclosure.

FIG. 5 is a flow diagram illustrating an example method of reading an MRAM element, in accordance with one or more aspects of this disclosure. In accordance with one or more techniques of this disclosure, memory system 2 may execute a method of reading an MRAM element. Link 12 may receive a control signal from data control module 4 (80). Link 12 may then relay the control signal to MRAM data array 6 and reference circuit 8 (82). MRAM data array 6 may comprise an MRAM element in one of a high state or a low state and a first capacitor situated between the MRAM element and a first reference voltage. In some examples, the state of the MRAM element defines a resistance of the MRAM element. Reference circuit 8 may comprise a resistor having a second resistance and a second capacitor situated between the resistor and a second reference voltage.

In some examples, the first resistance is a low resistance when the MRAM element is in a low state, and the first resistance is a high resistance when the MRAM element is in a high state. In some instances of these examples, the MRAM element has a value of 0 when the MRAM element is in a low state, and the MRAM element has a value of 1 when the MRAM element is in a high state. Further, in some instances, the second resistance is approximately equal to an average of the low resistance and the high resistance of the MRAM element. For the purposes of this disclosure, "approximately" can mean within +/−10% of the average. In some cases, to accomplish this configuration of the second resistance, the resistor in the second circuit comprises two pairs of MRAM elements arranged in parallel, wherein each pair of MRAM elements comprises one MRAM element in a high state and one MRAM element in a low state.

In some examples, MRAM data array 6 further comprises a data array comprising a plurality of MRAM elements. In some instances, the plurality of MRAM elements in the first circuit are arranged in parallel, with MRAM data array 6 further comprising a plurality of switches. Each switch of the plurality of switches is situated before each respective MRAM element, and the control signal is configured to activate one of the pluralities of switches corresponding to the MRAM element to be read. In some examples, the MRAM data array 6 further comprises a second plurality of switches, each switch of the second plurality of switches situated after each MRAM element. Each switch in the second plurality of switches activates a link between the respective MRAM element and the first capacitor. MRAM data array 6 may further comprise a third plurality of switches, each switch of the third plurality of switches situated after each respective MRAM element. Each switch in the third plurality of switches activates a link between the respective MRAM element and a respective second MRAM element in the data array. The control signal may further be configured to activate a subset of the first plurality of switches, the second plurality of switches, and the third plurality of switches such that multiple MRAM elements may be read concurrently by the memory system.

In other examples, the plurality of MRAM elements may be arranged in series. In such examples, the second resistor comprises a plurality of sets of two pairs of MRAM elements arranged in parallel. Each set of two pairs of MRAM elements comprises a first MRAM element in a high state and a second MRAM element in a low state in series parallel to a third MRAM element in a high state and a fourth MRAM element in a low state in series, and the number of MRAM elements in series in the first circuit is equal to the number of sets of two pairs of MRAM elements in the second circuit.

MRAM data array 6 may charge the first capacitor (84). Responsive to the first capacitor being charged, MRAM data array 6 may output a data signal (86). While MRAM data array 6 is charging the first capacitor, reference circuit 8 may charge the second capacitor (88). Responsive to the second capacitor being charged, reference circuit 8 may output a reference signal (90).

Arbiter circuit 10 may receive the data signal from MRAM data array 6 and may receive the reference signal from reference circuit 8. In some examples, arbiter circuit 10 is a set-reset latch (SR latch). Arbiter circuit 10 may determine whether the data signal or the reference signal arrived first (92). Arbiter circuit 10 may then, based at least in part on determining whether the data signal or the reference signal arrived first, determine whether MRAM element 20 is in a high state or a low state (94). For instance, if arbiter circuit 10 determines that the data signal arrived before the reference signal, then arbiter circuit 10 may determine that MRAM element 20 of MRAM data array 6 is in a low state. Alternatively, if arbiter circuit 10 determines that the reference signal arrived before the data signal, then arbiter circuit 10 may determine that MRAM element 20 of MRAM data array 6 is in a high state.

The various circuits described in this disclosure, including read control circuit 4, arbiter circuit 10, and others may be implemented as any of a variety of types and combinations of circuit elements, including, but not limited to, central processing units (CPUs), field programmable gate arrays (FPGAs), application-specific integrated circuits (ASICs), microcontrollers, programmable logic controllers (PLCs). The circuits described herein may be implemented as a subset of any of the above, an interconnected or distributed combination of any of the above, or any other type of component or one or more components capable of being configured to carry out the functions described herein.

The techniques described herein may be able to produce integrated circuits that implement logic using a CMOS process technology. The circuit components described in this disclosure can be implemented as discrete components, as one or more elements of one or more integrated devices, or any combination thereof. The circuit components described herein may be fabricated using any of a wide variety of process technologies including CMOS process technologies, including either standard or custom CMOS process technologies. In addition, the circuitry described herein may be used in various applications including telecommunications applications, general computing application, or any application that may make use of an MRAM element able to be read in high temperature conditions, such as deep hole drilling.

Various examples of the disclosure have been described. Any combination of the described operations or functions is contemplated. These and other examples are within the scope of the following claims.

The invention claimed is:

1. A memory system comprising:
   a control module configured to output a control signal;
   a first circuit configured to receive the control signal from the control module, the first circuit comprising:
      a magnetoresistive random access memory (MRAM) element in one of a high state or a low state, wherein a first resistance of the MRAM element defines a state of the MRAM element; and
      a first capacitor situated between the MRAM element and a first reference voltage, wherein the first circuit is configured to output a data signal after the first capacitor is charged;
   a second circuit configured to receive the control signal from the control module to the second circuit, the second circuit comprising:
      a resistor having a second resistance; and
      a second capacitor situated between the resistor and a second reference voltage, wherein the second circuit is configured to output a reference signal after the second capacitor is charged; and
   an arbiter configured to:
      receive the data signal from the first circuit;
      receive the reference signal from the second circuit;
      determine whether the data signal or the reference signal arrived first; and
      determine whether the MRAM bit of the first circuit is in a high state or a low state based at least in part on determining whether the data signal or the reference signal arrived at the arbiter first.

2. The memory system of claim 1, wherein the first resistance is a low resistance when the MRAM element is in a low state, and wherein the first resistance is a high resistance when the MRAM element is in a high state.

3. The memory system of claim 2, wherein the MRAM element has a value of 0 when the MRAM element is in a low state, and wherein the MRAM element has a value of 1 when the MRAM element is in a high state.

4. The memory system of claim 2, wherein the second resistance is approximately equal to an average of the low resistance and the high resistance of the first resistance.

5. The memory system of claim 4, wherein the resistor in the second circuit comprises two pairs of MRAM elements arranged in parallel, wherein each pair of MRAM elements comprises one MRAM element in a high state and one MRAM element in a low state.

6. The memory system of claim 1, wherein the arbiter determines that the MRAM element is in a high state in response to determining that the reference signal arrives before the data signal.

7. The memory system of claim 1, wherein the arbiter determines that the MRAM element is in a low state in response to determining that the data signal arrives before the reference signal.

8. The memory system of claim 1, wherein the first circuit further comprises a data array comprising a plurality of MRAM elements.

9. The memory system of claim 8, wherein the plurality of MRAM elements in the first circuit are arranged in parallel, wherein the first circuit further comprises a plurality of switches, wherein each switch of the plurality of switches is situated before each MRAM element, and wherein the control signal is configured to activate one of the plurality of switches corresponding to the MRAM element to be read.

10. The memory system of claim 9, wherein the plurality of switches is a first plurality of switches, wherein the first circuit further comprises:
 a second plurality of switches, each switch of the second plurality of switches situated after each MRAM element, wherein each switch in the second plurality of switches activates a link between the respective MRAM element and the first capacitor; and
 a third plurality of switches, each switch of the third plurality of switches situated after each MRAM element, wherein each switch in the third plurality of switches activates a link between the respective MRAM element and a respective second MRAM element in the data array,
 wherein the control signal is further configured to activate a subset of the first plurality of switches, the second plurality of switches, and the third plurality of switches such that multiple MRAM elements may be read concurrently by the memory system.

11. The memory system of claim 8, wherein plurality of MRAM elements in the first circuit are arranged in series, wherein the second resistor comprises a plurality of sets of two pairs of MRAM elements arranged in parallel, wherein each set of two pairs of MRAM elements comprises a first MRAM element in a high state and a second MRAM element in a low state in series parallel to a third MRAM element in a high state and a fourth MRAM element in a low state in series, and wherein the number of MRAM elements in series in the first circuit is equal to the number of sets of two pairs of MRAM elements in the second circuit.

12. A method of reading a magnetoresistive random access memory (MRAM) element comprising:
 receiving, by a first circuit and a second circuit, a control signal from a control module, wherein the first circuit comprises the MRAM element in one of a high state or a low state, wherein the first resistance of the MRAM element defines a state of the MRAM element, and a first capacitor situated between the MRAM element and a first reference voltage, and wherein the second circuit comprises a resistor having a second resistance and a second capacitor situated between the resistor and a second reference voltage;
 charging, by the first circuit, the first capacitor;
 charging, by the second circuit, the second capacitor;
 responsive to the first capacitor being charged, outputting, by the first circuit, a data signal;
 responsive to the second capacitor being charged, outputting, by the second circuit, a reference signal;
 receiving, by an arbiter, the data signal from the first circuit;
 receiving, by the arbiter, the reference signal from the second circuit;
 determining, by the arbiter, whether the data signal or the reference signal arrived first; and
 determining, by the arbiter, whether the MRAM element is in a high state or a low state based at least in part on determining whether the data signal or the reference signal arrived first.

13. The method of claim 12, wherein the first resistance is a low resistance when the MRAM element is in a low state, and wherein the first resistance is a high resistance when the MRAM element is in a high state.

14. The method of claim 13, wherein the MRAM element has a value of 0 when the MRAM element is in a low state, and wherein the MRAM element has a value of 1 when the MRAM element is in a high state.

15. The method of claim 13, wherein the second resistance is approximately equal to an average of the low resistance and the high resistance of the first resistance.

16. The method of claim 15, wherein the resistor in the second circuit comprises two pairs of MRAM elements arranged in parallel, wherein each pair of MRAM elements comprises one MRAM element in a high state and one MRAM element in a low state.

17. The method of claim 12, wherein the arbiter determines that the MRAM element is in a high state in response to determining that the reference signal arrives before the data signal, and wherein the arbiter determines that the MRAM element is in a low state in response to determining that the data signal arrives before the reference signal.

18. The method of claim 12, wherein the first circuit further comprises a data array comprising a plurality of MRAM elements.

19. The method of claim 18, wherein the plurality of MRAM elements in the first circuit are arranged in parallel, wherein the first circuit further comprises:
 a first plurality of switches, wherein each switch of the first plurality of switches is situated before each MRAM element;
 a second plurality of switches, each switch of the second plurality of switches situated after each MRAM element, wherein each switch in the second plurality of switches activates a link between the respective MRAM element and the first capacitor; and
 a third plurality of switches, each switch of the third plurality of switches situated after each MRAM element, wherein each switch in the third plurality of switches activates a link between the respective MRAM element and a respective second MRAM element in the data array,
 wherein the control signal is further configured to activate a subset of the first plurality of switches, the second plurality of switches, and the third plurality of switches such that multiple MRAM elements may be read concurrently by the memory system.

20. The method of claim 18, wherein plurality of MRAM elements in the first circuit are arranged in series, wherein the second resistor comprises a plurality of sets of two pairs of MRAM elements arranged in parallel, wherein each set of two pairs of MRAM elements comprises a first MRAM element in a high state and a second MRAM element in a low state in series parallel to a third MRAM element in a high state and a fourth MRAM element in a low state in series, and wherein the number of MRAM elements in series in the first circuit is equal to the number of sets of two pairs of MRAM elements in the second circuit.

\* \* \* \* \*